(12) United States Patent
Longueville et al.

(10) Patent No.: US 6,695,633 B2
(45) Date of Patent: Feb. 24, 2004

(54) PRINTED CIRCUIT BOARD AND CONNECTOR ASSEMBLY

(75) Inventors: Jacques Longueville, Oostkamp (BE); Tom Ocket, Torhout (BE); Albert Hoolhorst, Be Aardenburg (NL)

(73) Assignee: Tyco Electronics Belgium EC N.V., Oost Kamp (BE)

( * ) Notice: Subject to any disclaimer, the term of this patent is extended or adjusted under 35 U.S.C. 154(b) by 0 days.

(21) Appl. No.: 10/203,552

(22) PCT Filed: Feb. 9, 2001

(86) PCT No.: PCT/IB01/00159

§ 371 (c)(1),
(2), (4) Date: Dec. 16, 2002

(87) PCT Pub. No.: WO01/59887

PCT Pub. Date: Aug. 16, 2001

(65) Prior Publication Data

US 2003/0139079 A1 Jul. 24, 2003

(30) Foreign Application Priority Data

Feb. 11, 2000  (DE) .......................................... 100 06 190

(51) Int. Cl.7 ................................................. H01R 13/62
(52) U.S. Cl. ..................................... 439/260; 439/325
(58) Field of Search ................................. 439/260, 259, 439/328, 325

(56) References Cited

U.S. PATENT DOCUMENTS

| 3,478,301 A | 11/1969 | Conrad et al. ................. 339/75 |
| 5,160,275 A | 11/1992 | Nakamura et al. .......... 439/328 |
| 5,897,393 A | * 4/1999 | Haftmann .................... 439/495 |

FOREIGN PATENT DOCUMENTS

| DE | 1 95 11 509 A1 | 10/1996 | ........... H01R/23/70 |
| EP | 0 884 808 A3 | 12/1998 | ........... H01R/23/68 |
| WO | WO 98/58426 | 12/1998 | ........... H01R/23/68 |
| WO | WO 98/58427 | 12/1998 | ........... H01R/23/68 |

* cited by examiner

Primary Examiner—Michael C. Zarroli

(57) ABSTRACT

A printed circuit board and a printed circuit board zero force connector are configured such that the printed circuit board zero force connector is properly actuated automatically by an attachment provided on the printed circuit board when the printed circuit board is plugged into and removed from the printed circuit board zero force connector.

6 Claims, 4 Drawing Sheets

PRINTED CIRCUIT BOARD AND CONNECTOR ASSEMBLY

BACKGROUND OF THE INVENTION

1. Filed of the Invention

The invention relates to a printed circuit board and a printed circuit board zero force connector.

2. Description of Related Art

Countless embodiments of printed circuit board assemblies of the aforementioned type have been known for many years. Printed circuit board connectors are used for connecting to printed circuit boards. In particular, if a very large number of surface contacts on the printed circuit board are to be contacted by associated contact elements of the printed circuit board connector, it is known to use so-called printed circuit board zero force connectors. Printed circuit board zero force connectors have likewise been known for many years in countless embodiments and are described, for example, in DE 195 11 509 A1, DE 197 25 123 A1, DE 197 25 132 A1 and DE 197 25 138 A1.

U.S. Pat. No. 5,160,275 describes a printed circuit board and connector assembly, comprising a printed circuit board with surface contacts arranged thereupon and a printed circuit board connector having a receiving region wherein the printed circuit board is inserted and a plurality of contact elements displaceable away and towards the receiving-region for insertion or removal of the printed circuit board or engagement of the surface contacts. The printed circuit board is provided with an attachment in the vicinity of that portion of the printed circuit board to be inserted into the printed circuit board connector, where the attachment and the contacts are in direct cooperation during insertion and removal to displace the contacts.

Printed circuit board zero force connectors have the particular feature that their contact elements are arranged on one or more movable parts and can be moved together with them. By moving the parts carrying the contact element, the printed circuit board zero force connector can be brought from an assembly position allowing an printed circuit board to be plugged into, or removed from a connecting position without the contacts touching the printed circuit board (zero insertion force). The parts carrying the contact elements may then be moved by the actuation of an actuating mechanism, for example a rod, which is mounted externally on the printed circuit board zero force connector and/or on the printed circuit board, so the connection is made. An actuating mechanism of this type requires a relatively large amount of space and also has to be operated following quite specific sequencing; otherwise, the printed circuit board and/or the printed circuit board zero force connector can be damaged and/or a proper connection is not achieved. This is a considerable drawback of printed circuit board zero force connectors. It is therefore an object of the present invention to find an option by which printed circuit board zero force connectors can be produced more compactly and easily and can be operated more reliably.

SUMMARY OF THE INVENTION

This object is achieved by the use of a printed circuit board having contact surfaces thereupon, an attachment, and a printed circuit board zero force connector. The assembly includes the printed circuit board zero force connector that carries contact elements arranged and configured in such a way that they are moved by an attachment mounted on the printed circuit board as the printed circuit board is plugged into the printed circuit board zero force connector and/or as the printed circuit board is removed from the printed circuit board zero force connector.

Since the printed circuit board connector is actuated by the attachment mounted on the printed circuit board as the printed circuit board is plugged into the printed circuit board connector, or as the printed circuit board is removed from the printed circuit board connector, there is no need to provide an actuating mechanism for displacing the contacts relative the surface contacts after insertion of the printed circuit board or prior to removal of the printed circuit board.

As the printed circuit board connector is actuated by the attachment provided on the printed circuit board it is advantagous that the attachment can be produced independently and then placed on the printed circuit board in such a way that neither the printed circuit board nor the attachment risks being damaged by actuation of the printed circuit board connector. An appropriate configuration and arrangement of the attachment reliably prevents the printed circuit board from rubbing against the printed circuit board connector (and the contacts therein) when being inserted into or removed from the printed circuit board connector. This possibility can never be completely ruled out in conventional printed circuit board connectors and when it occurs will sooner or later damage and/or reduce the functioning of the printed circuit board and/or of the printed circuit board connector.

As a result of the proposed innovations, printed circuit board zero force connectors can be produced compactly, easily, with less complenty, and can be operated more reliably. Advantageous developments of the invention can be inferred from the sub-claims, the following description and the figures.

BRIEF DESCRITPION OF THE DRAWINGS

The invention will be described in more detail hereinafter by embodiments with reference to the figures, in which.

DETAILED DESCRITPION OF THE PREFERRED EMBODIMENT

The printed circuit board described hereinafter is a printed circuit board which is designed to be connected via a printed circuit board zero force connector to another printed circuit board or a different component of the system containing the printed circuit board. The printed circuit board is connected to the printed circuit board zero force connector via surface contacts provided on the printed circuit board. The surface contacts are arranged in such a way that they can be contacted by contact elements of a printed circuit board zero force connector. The printed circuit board zero force connector is normally mounted on another printed circuit board (not shown in the figures) to which it is desired that the currently considered printed circuit board is to be connected.

For the sake of completeness, it is mentioned at this point that only the components of the considered printed circuit board and of the considered printed circuit board zero force connector, which are of particular interest here, are shown and described. The components of the printed circuit board and of the printed circuit board zero force connector which are not shown do not have special features and do not require further explanation.

The currently considered printed circuit board is provided, in the region that includes the surface contacts and comes to rest in the printed circuit board connector, with an attachment. The attachment provides that the printed circuit board connector can be brought from an assembly position where the printed circuit board can be plugged into or removed from a connecting position.

The currently considered printed circuit board zero force connector has parts carrying the contact elements that are arranged and configured in such a way that the parts and associated contacts are moved by the attachment mounted on the printed circuit board, as the printed circuit board is plugged into or as removed from the printed circuit board zero force connector.

Figure 1:
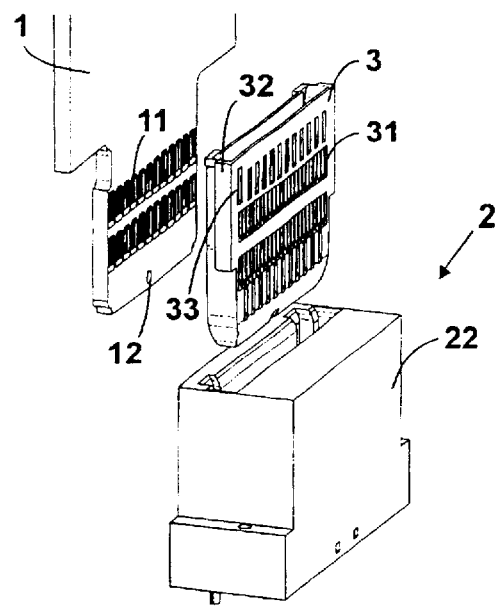
FIG. 1 shows a printed circuit board with an attachment that can be slipped thereupon and a printed circuit board zero force connector for contacting the printed circuit board.

The currently considered printed circuit board, the attachment to be placed on it and the printed circuit board zero force connector are shown in FIG. 1. The printed circuit board 1, has surface contacts 11 provided thereupon. An attachment 3 which can be placed on the printed circuit board 1 is shown adjacent thereto. Also shown is a printed circuit board zero force connector 2.

In the considered example, the attachment 3 is a cap or sleeve-like member that is preferably produced from plastic. The attachment 3 can be slipped onto the printed circuit board 1 in the region of the surface contacts 11. The printed circuit board 1 with the cap 3 slipped on is shown in FIGS. 2 to 6. The attachment 3 has recesses 31 at the positions which come to rest above the surface contacts 11 of the printed circuit board 1 once the attachment 3 has been slipped onto the printed circuit board. The contact elements 21 (Figure) of the printed circuit board connector 2 come into contact with the surface contacts 11 of the printed circuit board 1 through these recesses 31. The attachment 3 is attached to the printed circuit board 1 by a pin, not shown in the figures, that engages hole 12 in the printed circuit board 1.

Figure 2:
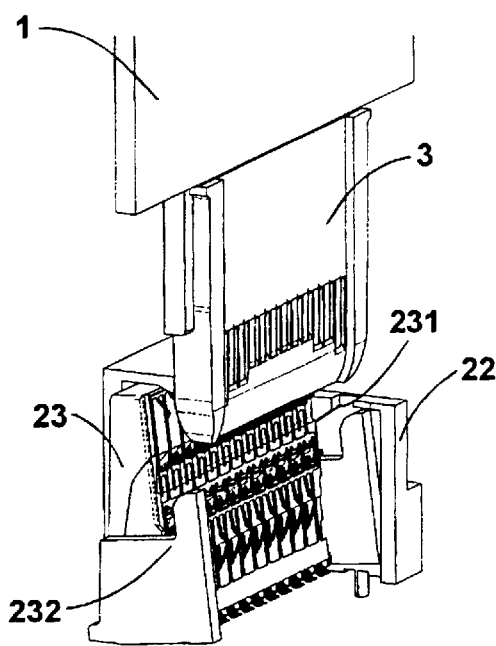
FIG. 2 shows the printed circuit board positioned to be inserted into the printed circuit board zero force connector.

As can be seen in FIG. 2, the printed circuit board zero force connector 2 includes, in addition to the above-mentioned contact elements 21, a housing 22 and a contact carrier 23 that carries the contact elements 21. The contact carrier 23 can be moved, together with the contact elements 21 carried by it, relative to the housing 22. In the considered example, the movement of the contact carrier 23 occurs by plugging a printed circuit board 1 into the printed circuit board zero force connector 2 and by removing the printed circuit board 1 from the printed circuit board zero force connector 2. This is described in more detail hereinafter with reference to FIGS. 2 to 6.

FIG. 2 also shows the state in which the insertion of a printed circuit board 1 provided with the attachment 3 into the printed circuit board zero force connector 2 has just begun. As shown in FIG. 2, the printed circuit board 1 does not yet contact the contact carrier 23.

Figure 3:
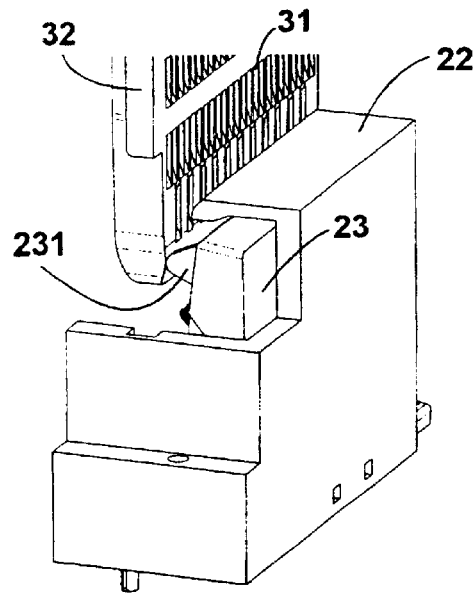
FIG. 3 shows intial insertion of the printed circuit board into the printed circuit board connector.

Upon further insertion of the printed circuit board 1 into the printed circuit board zero force connector 2, a leading end of the attachment 3, with respect to the direction of insertion, abuts a tab 231 that is provided in an upper region of the contact carrier 23. The tab 231 extends from the contact carrier 23 into a receiving region of the printed circuit board zero force connector 2. The receiving region is passed through by the printed circuit board 1 when the printed circuit board is inserted into the printed circuit board zero force connector. As attachment 3 and tab 231 act upon one another, the tab 231 is deflected to one side during insertion and is held in this position. The contact carrier 23 is pivoted to the side by the force exerted upon the tab 231, thereby enabeling the printed circuit board to be inserted further into the printed circuit board zero force connector without or, in any case, without significant expenditure of force to overcome insertion forces exerted by the contacts 21. The printed circuit board zero force connector is thus set into an assembly position that allows the insertion, or removal, of an printed circuit board. This state is shown in FIG. 3.

Figure 4:
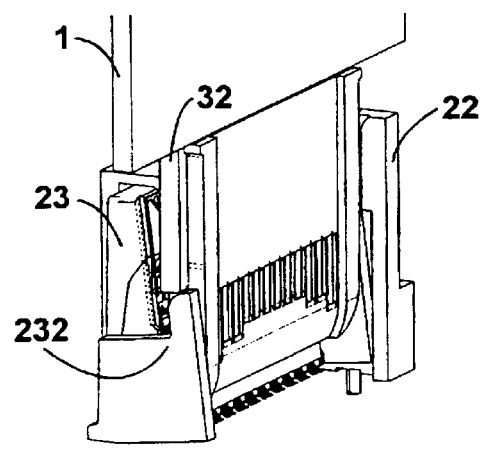
FIG. 4 shows further insertion of the printed circuit board into the printed circuit board connector.

As insertion of the printed circuit board 1 continues, a lateral projection 32 upon attachment 3 impinges on an arm 232 provided in a lower region of the contact carrier 23 that, similarly to the tab 231 of the contact carrier 23, extends into the receiving region of the printed circuit board zero force connector. The printed circuit board 1 also passes through this portion (where arm 232 is located) of the receiving region as the printed circuit board is plugged into the printed circuit board zero force connector 2. This is shown in FIG. 4.

Figure 5:
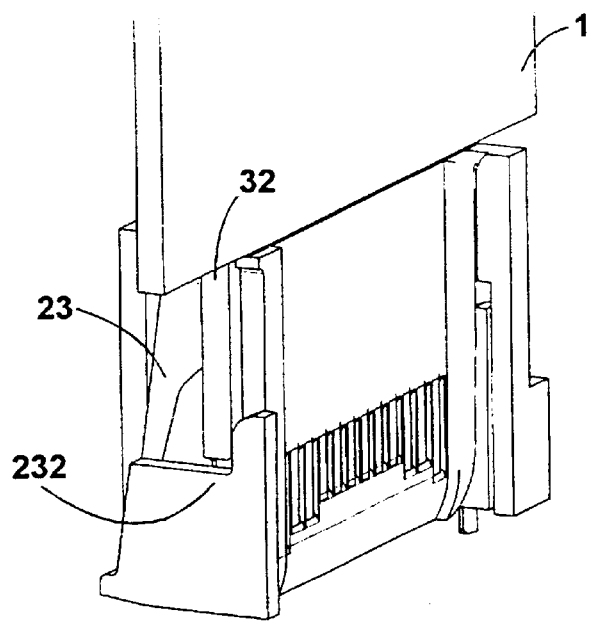
FIG. 5 shows a front view of the fully inserted printed circuit board.

As insertion of the printed circuit board 1 into the printed circuit board zero force connector 2 continues, the attachment 3 by way of lateral projection 32 presses arm 232 downwards. This results in the contact carrier 23 pivoting causing the upper part of the contact carrier 23 to pivot toward the printed circuit board 1. FIG. 5 shows the state in which this occurred. As the contact carrier 23 pivots, tab 231 of the contact carrier 23, which until now has been out of the way by the attachment 3, passes into an associated recess 33 in the attachment 3. This is shown in FIG. 6.

The speed and the course of the pivoting movement of the contact element carrying part 23 can be adjusted owing to the shape of the attachment 3 (lateral projection 32) and owing to the shape of the arm 232 of the contact carrier 23. In the considered example, the lateral projection 32 of the attachment 3 and the arm 232 of the contact carrier 23 are configured in such a way that insertion of the printed circuit board 1 into the printed circuit board zero force connector 2 at constant speed initially brings about relatively rapid deflection of the contact carrier 23 and then, comparatively slow, and increasingly slow, pivoting of the contact carrier 23. The force that is expended in order to plug the printed circuit board 1 into the printed circuit board zero force connector 2 can therefore be kept constant with a uniform plug-in speed. The increased resistance which has to be overcome during pivoting in this stage is compensated by the comparatively slow pivoting of the contact carrier 23 toward the end of the pivoting process. The increased resistance is caused by the contact elements 21 of the printed circuit board zero force connector 2 that are carried by the contact carrier 23 engaging the printed circuit board 1 and the associated spring forces complicate further pivoting of the contact carrier 23.

Figure 6:
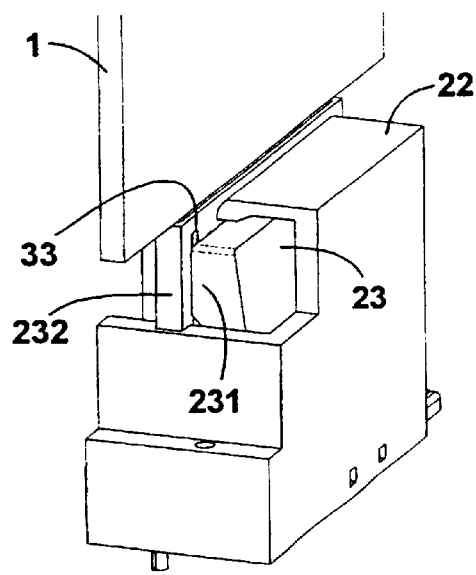
FIG. 6 shows a back view of the fully inserted printed circuit board corresponding to FIG. 5.

In the state shown in FIGS. 5 and 6 the printed circuit board 1 is in the fully inserted position, and the printed circuit board zero force connector 2 is in its connection position correctly contacting the printed circuit board 1 inserted therein. The contact elements 21 held by the contact carrier 23 are correctly contacting the associated surface contacts 11 of the printed circuit board by extending through the recesses 31 of the attachment 3. In this state, the printed circuit board 1 is seated within the printed circuit board zero force connector 2; the tab 231 of the contact carrier 23 position in the recess 33 in attachment 3 which advantageously prevents the printed circuit board 1 from being released from the printed circuit board zero force connector 2. The retention can be overcome by pulling upon the printed circuit board 1 opposite the direction of insertion (i.e. removal).

The above-mentioned processes are reversed when the printed circuit board 1 is being removed from the printed circuit board zero force connector 2. It should be mentioned, that the processes now taking place in removing the printed circuit board 1 are now assisted by the contact elements 21 of the printed circuit board zero force connector 2. The spring forces of the contact elements 21, assist the pivoting of the contact carrier 23 from the printed circuit board 1 when the force pressing the arm 232 downward and holding it down wanes and finally disappears upon removal of the printed circuit board 1 from the printed circuit board zero force connector 2.

It should be obvious that the described printed circuit board and the described printed circuit board zero force connector can be varied in many ways with substantially the same functioning and mode of operation. In particular, there is no restriction on how the attachment 3 is formed. Either a cap, which can be slipped onto the printed circuit board, or for example, one or more plate-like elements or other discreate components which are placed onto the printed circuit board can also be used instead of a cap. It would also be conceivable to form the attachment not by a separate part but, for example, by injection moulding a corresponding configuration onto the printed circuit boardor forming the printed circuit board in a particular manner. Furthermore, there is no restriction to the described type of connection between the printed circuit board 1 and the attachment 3. The printed circuit board 1 and the attachment 3 can basically be connected detachably or non-detachably to one another in any way, for example by clamping, pressing into one another, adhesion, etc.

Figure 7:
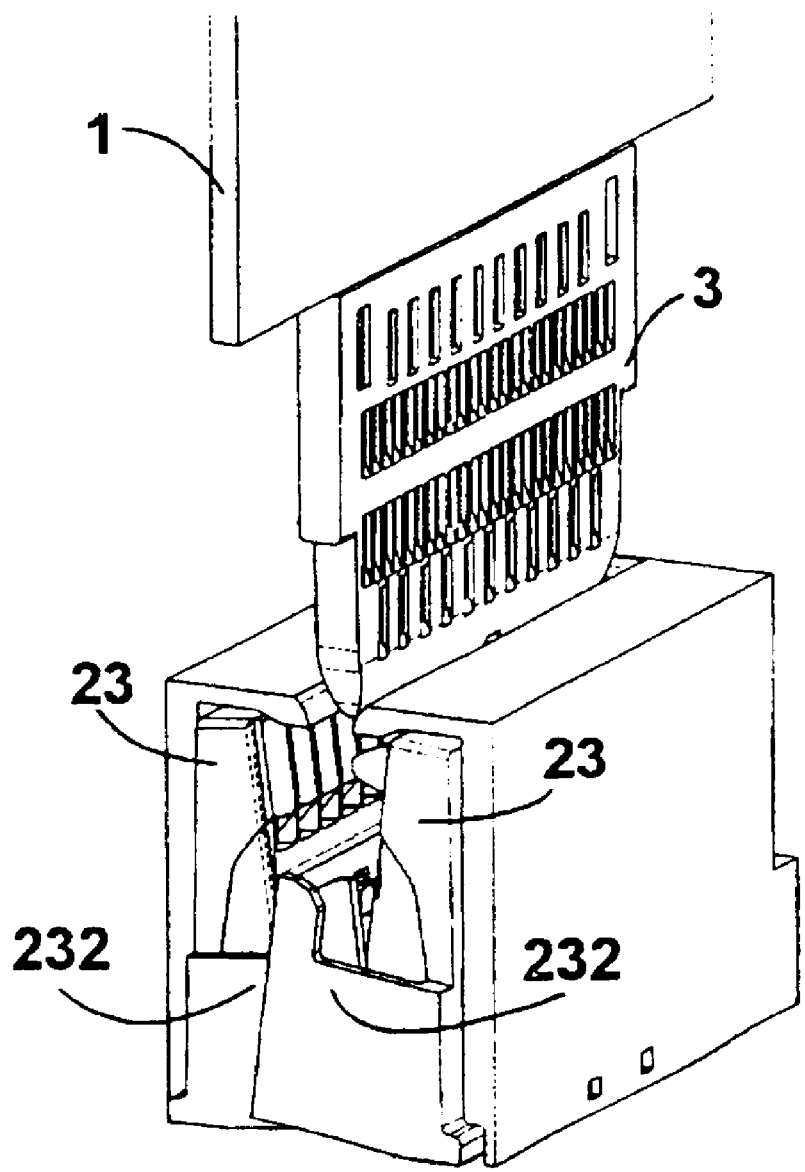
FIG. 7 shows a modified configuration of the printed circuit board zero force connector.

Furthermore, there is no restriction that the printed circuit board 1 has surface contacts 11 only on one side. The printed circuit board 1 can be provided with surface contacts 11 on both sides and the printed circuit board connector 2 can be designed to make contact with printed circuit boards 1 of this type. A printed circuit board connector of this type can be produced, for example, by providing, opposite the (first) contact carrier 23, a second contact carrier which moves symmetrically to the first contact carrier when a printed circuit board is plugged in and removed; a contact carrier part of this type is shown in FIG. 7.

Owing to the above-described features of the printed circuit board and of the printed circuit board zero force connector it is possible, regardless of the details of practical production, to produce printed circuit board zero force connectors particularly compactly and easily and to operate them reliably.

We claim:

1. A printed circuit board and connector assembly comprising:

a printed circuit board with surface contacts arranged thereupon, a printed circuit board connector having a receiving region for receiving a portion of the printed circuit board, a plurality of contact elements displaceable away and towards the receiving region for insertion or removal of the printed circuit board or engagement of the surface contacts, the printed circuit board having an attachment in a vicinity of the portion of the printed circuit board that is to be inserted into the printed circuit board connector, wherein the attachment and the connector cooperate during insertion and removal to displace the contacts, characterized in that a contact carrier carries the contact elements, the attachment includes a biasing surface, the contact carrier includes a tab extending into the receiving region, and the biasing surface and the tab cooperate to displace the contact elements during insertion of the printed circuit board, the attachment further includes a lateral projection and the contact carrier includes an arm that cooperates with the lateral projection to displace the contact elements toward the receiving region during insertion of the printed circuit board, and the attachment includes a recess for receiving the tab upon full insertion of the printed circuit board into the connector.

2. The printed circuit board and connector assembly of claim 1, wherein the recess and the tab cooperate to retain the printed circuit board in the connector.

3. The printed circuit board and connector assembly of claim 1, wherein the attachment includes recesses corresponding to the surface contacts.

4. The printed circuit board and connector assembly of claim 1, wherein the printed circuit board has surface contacts on both sides and the connector has two contact carriers arranged in opposed positions.

5. The printed circuit board and connector assembly of claim 1, wherein the attachment has the form of a cap that can be slipped over the printed circuit board.

6. The printed circuit board and connector assembly of claim 1, wherein the attachment is injection moulded onto the printed circuit board.

* * * * *